(12) United States Patent
Li

(10) Patent No.: US 10,170,067 B2
(45) Date of Patent: *Jan. 1, 2019

(54) GOA ELECTRIC CIRCUIT BASED ON LTPS SEMICONDUCTOR THIN-FILM TRANSISTORS

(71) Applicant: WUHAN CHINA STAR OPTOELECTRONICS TECHNOLOGY CO., LTD., Wuhan, Hubei (CN)

(72) Inventor: Yafeng Li, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 102 days.

This patent is subject to a terminal disclaimer.

(21) Appl. No.: 15/308,843

(22) PCT Filed: Jun. 13, 2016

(86) PCT No.: PCT/CN2016/085597
§ 371 (c)(1),
(2) Date: Nov. 4, 2016

(87) PCT Pub. No.: WO2017/197683
PCT Pub. Date: Nov. 23, 2017

(65) Prior Publication Data
US 2018/0114498 A1 Apr. 26, 2018

(30) Foreign Application Priority Data
May 18, 2016 (CN) .......................... 2016 1 0331102

(51) Int. Cl.
*G09G 3/36* (2006.01)
*G02F 1/1345* (2006.01)
(Continued)

(52) U.S. Cl.
CPC ....... *G09G 3/3677* (2013.01); *G02F 1/13454* (2013.01); *G02F 1/1368* (2013.01);
(Continued)

(58) Field of Classification Search
CPC ... G09G 2300/0408; G09G 2300/0417; G09G 2300/0814; G09G 2300/0819;
(Continued)

(56) References Cited

U.S. PATENT DOCUMENTS 7,949,086 B2 * 5/2011 Tsai ........................ G11C 19/28
377/64
9,875,709 B2 1/2018 Li
(Continued)

FOREIGN PATENT DOCUMENTS

| CN | 105355187 A | 2/2016 |
|---|---|---|
| CN | 105390086 A | 3/2016 |

(Continued)

*Primary Examiner* — Jeffrey A Gaffin
*Assistant Examiner* — Richard M Russell
(74) *Attorney, Agent, or Firm* — Mark M. Friedman

(57) ABSTRACT

A GOA electric circuit introduces a resistor and a timing signal, which are used to replace a second capacitor in the existing skills. One terminal of the resistor is connected to a constant high voltage level and the other terminal thereof is connected to a gate electrode of a ninth thin-film transistor. A source electrode of the ninth thin-film transistor is electrically connected to the timing signal. In the stage maintaining the output terminal at low voltage level, the voltage level of the second node can be changed between high and low voltage levels as the timing signal is changed, and the voltage level of the second node is pulled down in a specific frequency. This effectively prevents the second node from being at high voltage level for a long time and avoids the problem of threshold voltage shifting, and therefore improves the stability of GOA electric circuit.

11 Claims, 5 Drawing Sheets

(51) Int. Cl.
  *G02F 1/1362* (2006.01)
  *G02F 1/1368* (2006.01)
  *H01L 27/12* (2006.01)

(52) U.S. Cl.
  CPC .. *G02F 1/136286* (2013.01); *G02F 2202/104* (2013.01); *G09G 2310/0283* (2013.01); *G09G 2310/0286* (2013.01); *H01L 27/124* (2013.01); *H01L 27/1222* (2013.01); *H01L 27/1255* (2013.01)

(58) Field of Classification Search
  CPC ... G09G 2300/0871; G09G 2310/0267; G09G 2310/061; G09G 2320/0214; G09G 2320/0219; G09G 2320/045; G09G 2330/021; G09G 3/3266; G09G 3/3674; G09G 3/3677; G09G 5/18; G11C 19/184; G11C 19/28
  See application file for complete search history.

(56) References Cited

U.S. PATENT DOCUMENTS

| | | | |
|---|---|---|---|
| 2008/0030445 A1 | 2/2008 | Choi et al. | |
| 2015/0279289 A1* | 10/2015 | Yu | G11C 19/28 345/690 |
| 2016/0351156 A1* | 12/2016 | Wu | G11C 19/28 |
| 2017/0270881 A1 | 9/2017 | Li | |
| 2018/0033389 A1 | 2/2018 | Li et al. | |
| 2018/0040600 A1 | 2/2018 | Li et al. | |

FOREIGN PATENT DOCUMENTS

| | | |
|---|---|---|
| CN | 105469756 A | 4/2016 |
| CN | 105469760 A | 4/2016 |

\* cited by examiner

GOA ELECTRIC CIRCUIT BASED ON LTPS SEMICONDUCTOR THIN-FILM TRANSISTORS

TECHNICAL FIELD OF THE DISCLOSURE

The present invention relates to a liquid crystal display technical field, and more particularly, to a GOA electric circuit based on LTPS semiconductor thin-film transistors capable of improving the stability of GOA electric circuit.

BACKGROUND OF THE DISCLOSURE

GOA (Gate Driver on Array, row scanning integrated on an array substrate) is a technology of manufacturing a row-scanning gate driving circuit on the array substrate by utilizing an existing TFT-LCD (Thin Film Transistor-Liquid Crystal Display) array process, carrying out progressive scan driving for gate lines. The GOA technology can reduce bonding procedures in connecting to an external IC (Integrated Circuit), has an opportunity to increase product yield and alter the cost, and can make a liquid crystal display panel become more suitable for manufacturing a display product with narrow bezel or without bezel.

As with the development of LTPS (Low Temperature Poly-silicon) semiconductor thin-film transistors, LTPS-TFT liquid crystal displays gather more and more attention. The LTPS-TFT liquid crystal displays have advantages including high resolution, fast in response, high brightness, and high aperture ratio. Also, since LTPS semiconductor itself possesses super high carrier mobility, the GOA technology may be adopted to manufacture a gate driver on a thin-film transistor array substrate to carry out the objective of system integration, save the space, and reduce the cost of driving ICs. In order to assure the stability of an output terminal G(n), two nodes Q(n) and P(n) generally are introduced. The point Q(n) is configured to control the output of a gate driving signal; and the point P(n) is configured to maintain the stability of low voltage levels of the Q(n) point and the output terminal G(n). Mutual restriction exists between the two nodes Q(n) and P(n).

Please refer to FIG. 1, which is a schematic diagram showing a GOA electric circuit based on LTPS semiconductor thin-film transistors in the existing skills. The GOA electric circuit comprises a plurality of cascaded GOA units. Assuming that n is a positive integer, the nth-stage GOA unit comprises a first thin-film transistor T1 having a gate electrode electrically connected to a first clock signal CK1, a source electrode electrically connected to an output terminal G(n−1) of a previous-stage (the (n−1)th stage) GOA unit, and a drain electrode electrically connected to a third node K(n); a second thin-film transistor T2 having a gate electrode electrically connected to a first node Q(n), a source electrode electrically connected to a second clock signal CK2, and a drain electrode electrically connected the an output terminal G(n); a third thin-film transistor T3 having a gate electrode electrically connected to a third clock signal CK3, a source electrode electrically connected to an output terminal G(n+1) of a next-stage (the (n+1)th stage) GOA unit, and a drain electrode electrically connected to the third node K(n); a fourth thin-film transistor T4 having a gate electrode electrically connected to a fourth clock signal CK4, a source electrode electrically connected to a constant low voltage level VGL, and a drain electrode electrically connected to the output terminal G(n); a fifth thin-film transistor T5 having a gate electrode electrically connected to a constant high voltage level VGH, a source electrode electrically connected to the third node K(n), and a drain electrode electrically connected to the first node Q(n); a sixth thin-film transistor T6 having a gate electrode electrically connected to a second node P(n), a source electrode electrically connected to the constant low voltage level VGL, and a drain electrode electrically connected to the third node K(n); a seventh thin-film transistor T7 having a gate electrode electrically connected to the second node P(n), a source electrode electrically connected to the constant low voltage level VGL, and a drain electrode electrically connected to the output terminal G(n); an eighth thin-film transistor T8 having a gate electrode electrically connected to the third node K(n), a source electrode electrically connected to the constant low voltage level VGL, and a drain electrode electrically connected to the second node P(n); a ninth thin-film transistor T9 having a gate electrode and a source electrode, both of which are electrically connected to the second clock signal CK2, and a drain electrode electrically connected to the second node P(n); a bootstrap capacitor C1, one terminal of which is electrically connected to the first node Q(n) and the other terminal of which is electrically connected to the output terminal G(n); and a second capacitor C2, one terminal of which is electrically connected to the second node P(n) and the other terminal of which is electrically connected to the constant low voltage level VGL.

The GOA electric circuit shown in FIG. 1 can not only perform a forward scanning but also a backward scanning. The processes of the forward scanning and the backward scanning are similar to each other. The following is described with the forward scanning as an example wither referring to FIG. 1 and FIG. 2. FIG. 2 is a timing chart of a forward scanning in the GOA electric circuit based on LTPS semiconductor thin-film transistors shown in FIG. 1 in the existing skills. The processes of the forward scanning are described below. Stage I (pre-charging): both of G(n−1) and CK1 are at high voltage level, T1 is turned on, the gate electrode of T5 is connected to the constant high voltage level VGH and thus T5 is always in a turned-on state, and the first node Q(n) is pre-charged to high voltage level. Stage II (the output terminal G(n) outputs high voltage level): G(n−1) and CK1 are changed to low voltage level, CK2 provides high voltage level, the first node Q(n) is maintained at high voltage level due to the storage function of the bootstrap capacitor C1, T2 is turned on, the high voltage level of CK2 is outputted to the output terminal G(n) and thus the output terminal G(n) outputs high voltage level and this makes the first node Q(n) be pulled up to a higher voltage level, and meanwhile, T8 is turned on, the voltage level of the second node P(n) is pulled down, and T6 and T7 is turned off. Stage III (the output terminal G(n) outputs low voltage level): both of CK3 and G(n+1) provide high voltage level, the first node Q(n) is still at high voltage level, CK2 is changed to low voltage level, the low voltage level of CK2 is outputted to the output terminal G(n), and thus the output terminal G(n) outputs low voltage level. Stage IV (the first node Q(n) is pulled down to the constant low voltage level VGL): CK1 provides high voltage level again, G(n−1) is maintained at low voltage level, T1 is turned on to pull down the voltage level of the first node Q(n) to the constant low voltage level VGL, and T8 is turned off. Stage V (the first node Q(n) and the output terminal G(n) are maintained at low voltage level): CK2 provides high voltage level, T9 is turned on, the second node P(n) is charged to high voltage level, T6 and T7 are turned on and thus continuously pull down the first node Q(n) and the output terminal G(n) respectively to the constant low voltage level VGL, the second node P(n) is continuously maintained at high voltage level due to the storage function of the second capacitor C2, T6 and T7 are continuously turned on in one frame period and thus maintain the first node Q(n) and the output terminal G(n) at low voltage level.

It is not difficult to see from FIG. 2 that the corresponding high voltage level of the second node P(n) approaches the constant high voltage level VGH (the high voltage level of the second node P(n) can be adjusted for a certain degree by using T9) and the low voltage level thereof is the constant low voltage level VGL (it cannot be altered). In the afore-described existing GOA electric circuit, the second node P(n) is always in a high-voltage-level state, that is, T6 and T7 are always in a turned-on state. T6 and T7 are operated for a long time and this results in a shift of the threshold voltages (Vth shift) of the two key thin-film transistors T6 and T7 and this decreases the stability of the circuit, thereby causing abnormal output of the GOA electric circuit.

Therefore, there is a need to provide a new GOA electric circuit for improving the stability of GOA electric circuit.

SUMMARY OF THE DISCLOSURE

The objective of the present invention is to provide a GOA electric circuit based on LTPS semiconductor thin-film transistors. In comparison to the GOA electric circuit based on LTPS semiconductor thin-film transistors in the existing skills, the present invention prevents a second node P(n) from being at high voltage level for a long time and avoids the problem of threshold voltage shifting caused by a sixth and a seventh thin-film transistors T6 and T7 operated for a long time, and therefore improves the stability of GOA electric circuit and the display quality of a liquid crystal panel.

To achieve above objective, the present invention provides a GOA (Gate Driver on Array) electric circuit based on LTPS (Low Temperature Poly-silicon) semiconductor thin-film transistors, comprising a plurality of cascaded GOA units and each stage thereof comprising a scan control module, an output module, a bootstrap capacitor, and a pull-down module; n is a positive integer, in a nth-stage GOA unit except for a first stage and a last stage: wherein the scan control module comprises a first thin-film transistor, a third thin-film transistor, and a fifth thin-film transistor; the first thin-film transistor has a gate electrode electrically connected to a first clock signal, a source electrode electrically connected to an output terminal G(n−1) of a previous-stage (the (n−1)th stage) GOA unit, and a drain electrode electrically connected to a third node; the third thin-film transistor has a gate electrode electrically connected to a third clock signal, a source electrode electrically connected an output terminal G(n+1) of a next-stage (the (n+1)th stage) GOA unit, and a drain electrode electrically connected to the third node; and the fifth thin-film transistor has a gate electrode electrically connected to a constant high voltage level, a source electrode electrically connected to the third node, and a drain electrode electrically connected to a first node; wherein the output module comprises a second thin-film transistor; the second thin-film transistor has a gate electrode electrically connected to the first node, a source electrode electrically connected to a second clock signal, and a drain electrode electrically connected to an output terminal G(n); wherein one terminal of the bootstrap capacitor is electrically connected to the first node and the other terminal thereof is electrically connected to the output terminal G(n); wherein the pull-down module comprises a fourth thin-film transistor, a sixth thin-film transistor, a seventh thin-film transistor, an eighth thin-film transistor, a ninth thin-film transistor, a tenth thin-film transistor, ad a resistor; the fourth thin-film transistor has a gate electrode electrically connected to a fourth clock signal, a source electrode electrically connected to a constant low voltage level, and a drain electrode electrically connected to the output terminal G(n); the sixth thin-film transistor has a gate electrode electrically connected to a second node, a source electrode electrically connected to the constant low voltage level, and a drain electrode electrically connected to the third node; the seventh thin-film transistor has a gate electrode electrically connected to the second node, a source electrode electrically connected to the constant low voltage level, and a drain electrode electrically connected to the output terminal G(n); the eighth thin-film transistor has a gate electrode electrically connected to the third node, a source electrode electrically connected to the constant low voltage level, and a drain electrode electrically connected to the second node; the ninth thin-film transistor has a gate electrode electrically connected to a fourth node, a source electrode electrically connected to a timing signal, a drain electrode electrically connected to the second node; the tenth thin-film transistor has a gate electrode electrically connected to the third node, a source electrode electrically connected to the constant low voltage level, and a drain electrode electrically connected to the fourth node; and one terminal of the resistor is electrically connected to the constant high voltage level and the other terminal thereof is electrically connected to the fourth node; and wherein all of the thin-film transistors are low temperature poly-silicon semiconductor thin-film transistors, the pulses of the first clock signal, the second clock signal, the third clock signal, and the fourth clock signal are sequentially outputted and are not overlapped with one another, and in the stage maintaining the output terminal G(n) at low voltage level, the voltage level of the second node is correspondingly changed between the high and low voltage levels as the timing signal is changed between the high and low voltage levels.

To achieve above objective, the present invention provides a GOA (Gate Driver on Array) electric circuit based on LTPS (Low Temperature Poly-silicon) semiconductor thin-film transistors, comprising a plurality of cascaded GOA units and each stage thereof comprising a scan control module, an output module, a bootstrap capacitor, and a pull-down module; n is a positive integer, in a nth-stage GOA unit except for a first stage and a last stage: wherein the scan control module comprises a first thin-film transistor, a third thin-film transistor, and a fifth thin-film transistor, the first thin-film transistor has a gate electrode electrically connected to a first clock signal, a source electrode electrically connected to an output terminal G(n−1) of a previous-stage (the (n−1)th stage) GOA unit, and a drain electrode electrically connected to a third node; the third thin-film transistor has a gate electrode electrically connected to a third clock signal, a source electrode electrically connected an output terminal G(n+1) of a next-stage (the (n+1)th stage) GOA unit, and a drain electrode electrically connected to the third node; and the fifth thin-film transistor has a gate electrode electrically connected to a constant high voltage level, a source electrode electrically connected to the third node, and a drain electrode electrically connected to a first node; wherein the output module comprises a second thin-film transistor, the second thin-film transistor has a gate electrode electrically connected to the first node, a source electrode electrically connected to a second clock signal, and a drain electrode electrically connected to an output terminal G(n); wherein one terminal of the bootstrap capacitor is electrically connected to the first node and the other terminal thereof is electrically connected to the output terminal G(n); and wherein the pull-down module comprises a fourth thin-film transistor, a sixth thin-film transistor, a seventh thin-film transistor, an eighth thin-film transistor, a ninth thin-film transistor, a tenth thin-film transistor, ad a resistor; the fourth thin-film transistor has a gate electrode electrically connected to a fourth clock signal, a source electrode electrically connected to a constant low voltage level, and a drain electrode electrically connected to the output terminal G(n); the sixth thin-film transistor has a gate electrode electrically connected to a second node, a source electrode electrically connected to the constant low voltage level, and a drain electrode electrically connected to the third node; the seventh thin-film transistor has a gate electrode electrically connected to the second node, a source electrode electrically connected to the constant low voltage level, and a drain electrode electrically connected to the output terminal G(n); the eighth thin-film transistor has a gate electrode electrically connected to the third node, a source electrode electrically connected to the constant low voltage level, and a drain electrode electrically connected to the second node; the ninth thin-film transistor has a gate electrode electrically connected to a fourth node, a source electrode electrically connected to a timing signal, a drain electrode electrically connected to the second node; the tenth thin-film transistor has a gate electrode electrically connected to the third node, a source electrode electrically connected to the constant low voltage level, and a drain electrode electrically connected to the fourth node; and one terminal of the resistor is electrically connected to the constant high voltage level and the other terminal thereof is electrically connected to the fourth node.

The advantages of the present invention are that the GOA electric circuit based on LTPS semiconductor thin-film transistors provided in the present invention introduces a resistor and a timing signal configured to adjust the high and low voltage levels of the second node P(n) and the frequency thereof. The resistor and the tenth thin-film transistor are used to replace a second capacitor in the existing skills. Also, the diode connection of a ninth thin-film transistor in the existing skills is changed. That is, one terminal of the resistor is connected to a constant high voltage level and the other terminal thereof is connected to a gate electrode of the ninth thin-film transistor. A source electrode of the ninth thin-film transistor is electrically connected to the timing signal. In the stage maintaining the output terminal G(n) at low voltage level, the voltage level of the second node P(n) can be correspondingly changed between high and low voltage levels as the timing signal is changed between high and low voltage levels, that is, the voltage level of the second node P(n) is pulled down in a specific frequency. This effectively prevents the second node P(n) from being at high voltage level for a long time and avoids the problem of threshold voltage shifting caused by a sixth and a seventh thin-film transistors T6 and T7 operated for a long time, and therefore improves the stability of GOA electric circuit. The GOA electric circuit provided in the present invention is applicable to a gate driving technical field for a cell phone, a display, and a television.

DETAILED DESCRIPTION OF THE DISCLOSURE

Figure 1:
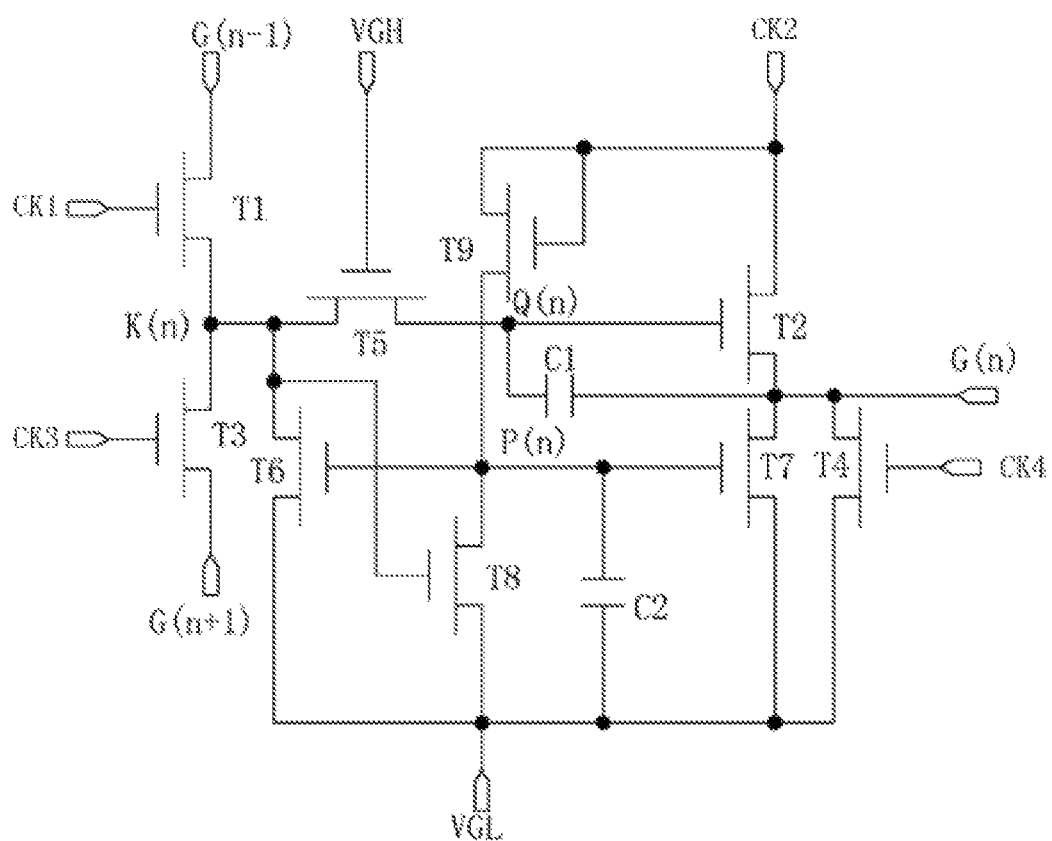
FIG. 1 is a schematic diagram showing a GOA electric circuit based on LTPS semiconductor thin-film transistors in the existing skills.
Figure 2:
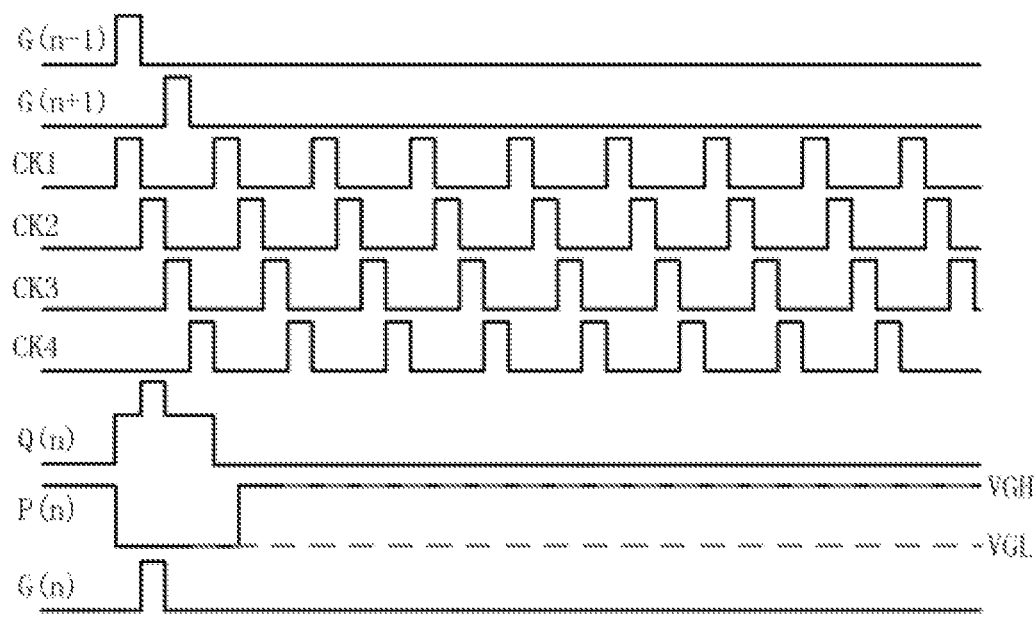
FIG. 2 is a timing chart of a forward scanning in the GOA electric circuit based on LTPS semiconductor thin-film transistors shown in FIG. 1 in the existing skills.

A GOA (Gate Driver on Array) electric circuit based on LTPS (Low Temperature Poly-silicon) semiconductor thin-film transistors provided in the present invention will be detailedly described with referring to the drawings.

Figure 3:
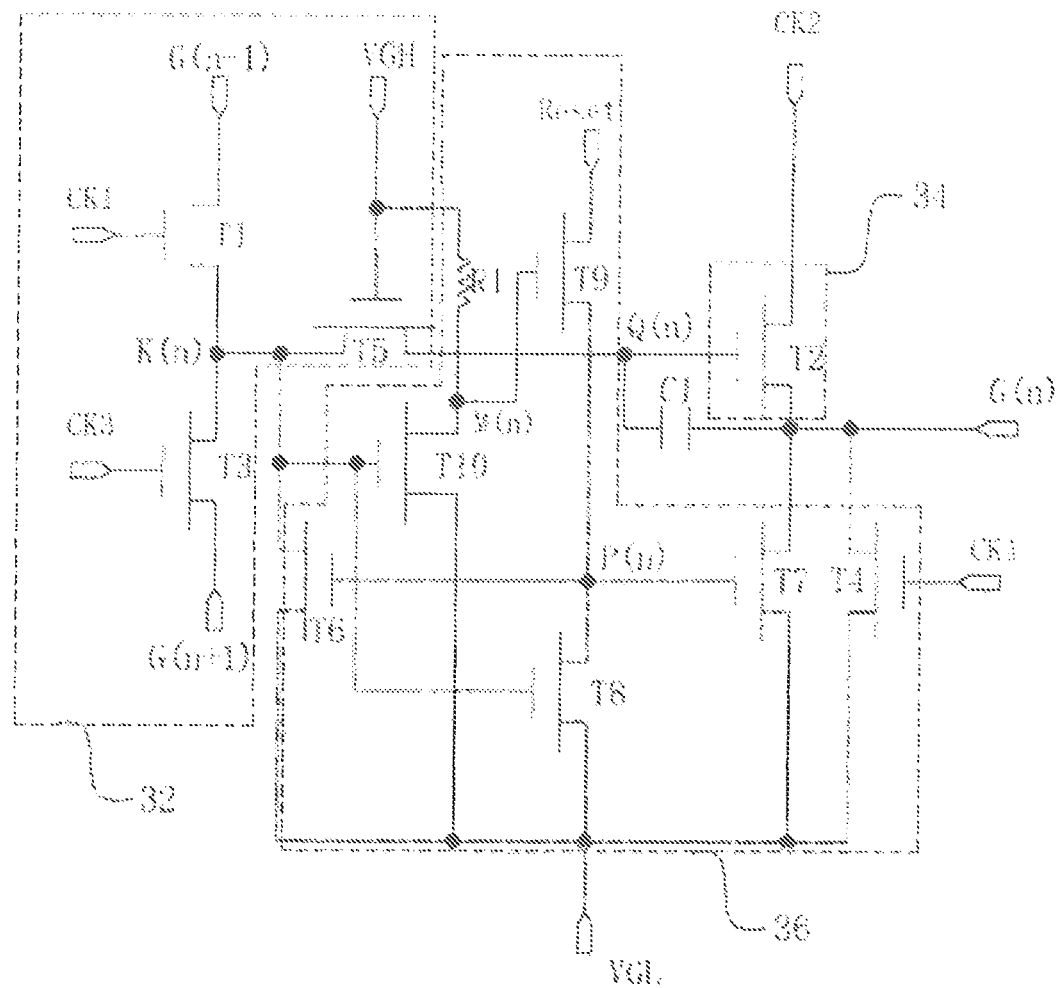
FIG. 3 is a schematic diagram showing a GOA electric circuit based on LTPS semiconductor thin-film transistors in accordance with the present invention.

Please refer to FIG. 3, which is a schematic diagram showing a GOA electric circuit based on LTPS semiconductor thin-film transistors in accordance with the present invention. The GOA electric circuit comprises a plurality of cascaded GOA units and each stage thereof comprises a scan control module 32, an output module 34, a bootstrap capacitor C1, and a pull-down module 36.

Assuming that n is a positive integer, in the nth-stage GOA unit except for the first stage and the last stage, the scan control module 32 comprises a first thin-film transistor T1, a third thin-film transistor T3, and a fifth thin-film transistor T5; the output module 34 comprises a second thin-film transistor T2; and the pull-down module 36 comprises a fourth thin-film transistor T4, a sixth thin-film transistor T6, a seventh thin-film transistor T7, an eighth thin-film transistor T8, a ninth thin-film transistor T9, a tenth thin-film transistor T10, ad a resistor R1.

In the scan control module 32, the first thin-film transistor T1 has a gate electrode electrically connected to a first clock signal CK1, a source electrode electrically connected to an output terminal G(n−1) of a previous-stage (the (n−1)th stage) GOA unit, and a drain electrode electrically connected to a third node K(n); the third thin-film transistor T3 has a gate electrode electrically connected to a third clock signal CK3, a source electrode electrically connected an output terminal G(n+1) of a next-stage (the (n+1)th stage) GOA unit, and a drain electrode electrically connected to the third node K(n); and the fifth thin-film transistor T5 has a gate electrode electrically connected to a constant high voltage level VGH, a source electrode electrically connected to the third node K(n), and a drain electrode electrically connected to a first node Q(n).

In the output module 34, the second thin-film transistor T2 has a gate electrode electrically connected to the first node Q(n), a source electrode electrically connected to a second clock signal CK2, and a drain electrode electrically connected to an output terminal G(n).

One terminal of the bootstrap capacitor C1 is electrically connected to the first node Q(n) and the other terminal thereof is electrically connected to the output terminal G(n).

In the pull-down module 36, the fourth thin-film transistor T4 has a gate electrode electrically connected to a fourth clock signal CK4, a source electrode electrically connected to a constant low voltage level VGL, and a drain electrode electrically connected to the output terminal G(n); the sixth thin-film transistor T6 has a gate electrode electrically connected to a second node P(n), a source electrode electrically connected to the constant low voltage level VGL, and a drain electrode electrically connected to the third node K(n); the seventh thin-film transistor T7 has a gate electrode electrically connected to the second node P(n), a source electrode electrically connected to the constant low voltage level VGL, and a drain electrode electrically connected to the output terminal G(n); the eighth thin-film transistor T8 has a gate electrode electrically connected to the third node K(n), a source electrode electrically connected to the constant low voltage level VGL, and a drain electrode electrically connected to the second node P(n); the ninth thin-film transistor T9 has a gate electrode electrically connected to a fourth node M(n), a source electrode electrically connected to a timing signal Reset, a drain electrode electrically connected to the second node P(n); the tenth thin-film transistor T10 has a gate electrode electrically connected to the third node K(n), a source electrode electrically connected to the constant low voltage level VGL, and a drain electrode electrically connected to the fourth node M(n); and one terminal of the resistor R1 is electrically connected to the constant high voltage level VGH and the other terminal thereof is electrically connected to the fourth node M(n).

Specifically, all of the thin-film transistors described in the present invention are low temperature poly-silicon (LTPS) semiconductor thin-film transistors.

Specifically, as to the afore-described four clock signals in the GOA electric circuit, the pulses of the first clock signal CK1, the second clock signal CK2, the third clock signal CK3, and the fourth clock signal CK4 are sequentially outputted and are not overlapped with one another.

Specifically, in the first-stage GOA unit, the source electrode of the first thin-film transistor T1 is electrically connected to a start signal STV; in the last-stage GOA unit, the source electrode of the third thin-film transistor T3 is electrically connected to the start signal STV. The GOA electric circuit based on LTPS semiconductor thin-film transistors provided in the present invention can not only perform a forward scanning stage by stage from the first stage to the last stage but also perform a backward scanning stage by stage from the last stage to the first stage. As to the forward scanning, the first-inputted clock signal (i.e., CK1 is a high voltage level) and the start signal STV are first provided to the first thin-film transistor T1 of the first-stage GOA unit. That is, in the forward scanning, both of the first clock signal CK1 and the output terminal G(n−1) of the previous-stage (the (n−1)th stage) GOA unit electrically connected to the first thin-film transistor T1 simultaneously provide a high voltage level. As to the backward scanning, the first-inputted clock signal (i.e., CK3 is a high voltage level) and the start signal STV are first provided to the third thin-film transistor T3 of the last-stage GOA unit. That is, in the backward scanning, both of the third clock signal CK3 and the output terminal G(n+1) of the next-stage (the (n+1)th stage) GOA unit electrically connected to the third thin-film transistor T3 simultaneously provide a high voltage level.

No matter in the forward scanning or in the backward scanning, the GOA electric circuit based on LTPS semiconductor thin-film transistors provided in the present invention can carry out pulling down the voltage level of the second node P(n) in a specific frequency.

Figure 4:
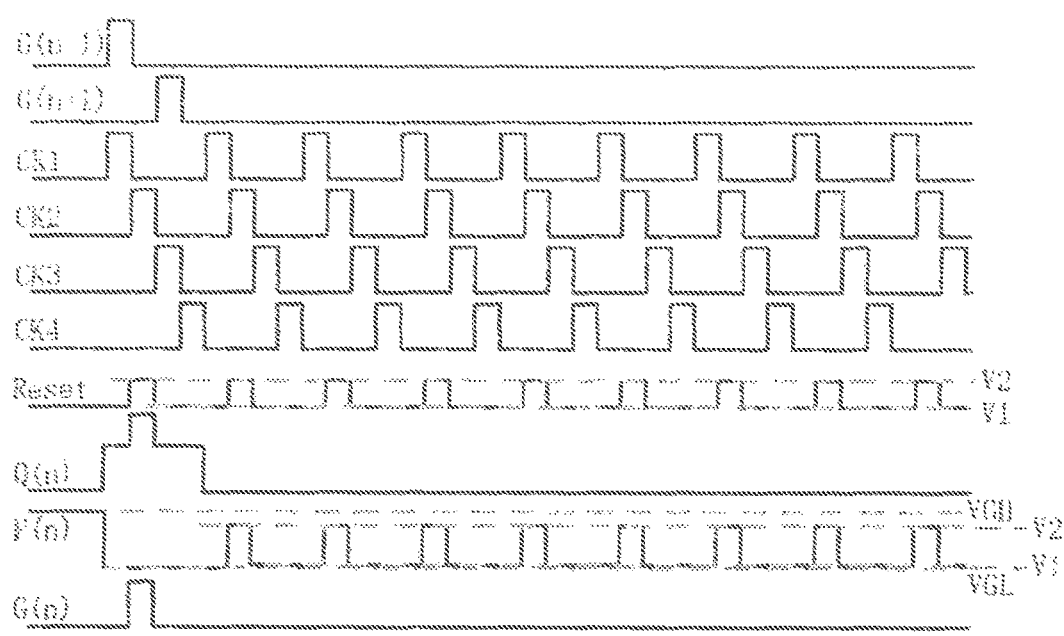
FIG. 4 is a timing chart of a forward scanning in the GOA electric circuit based on LTPS semiconductor thin-film transistors shown in FIG. 3 in accordance with the present invention.

Please refer to FIG. 4, which is a timing chart of a forward scanning in the GOA electric circuit based on LTPS semiconductor thin-film transistors shown in FIG. 3 in accordance with the present invention. The processes of the forward scanning are described below.

Stage I (pre-charging): both of the clock signal CK1 and the output terminal G(n−1) provide high voltage level, and all of the clock signals CK2, CK3, and CK4 provide low voltage level as well as the output terminal G(n+1); the first thin-film transistor T1 is turned on by the clock signal CK1, the third node K(n) is pre-charged to high voltage level, and the eighth and the tenth thin-film transistors T8 and T10 are turned on by the third node K(n); the fifth thin-film transistor T5 is always turned on by the constant high voltage level VGH, and thus the voltage level of the first node Q(n) is always the same as that of the third node K(n), that is, the first node Q(n) is pre-charged to high voltage level; the second and the fourth nodes P(n) and M(n) are pulled down to the constant low voltage level VGL, the sixth and the seventh thin-film transistors T6 and T7 controlled by the second node P(n) are turned off, and the ninth thin-film transistor T9 controlled by the fourth node M(n) is turned off.

Stage II (the output terminal G(n) outputs high voltage level): the clock signal CK1 and the output terminal G(n−1) are changed to low voltage level, the clock signal CK2 provides high voltage level, and the clock signals CK3 and CK4 and the output terminal G(n+1) still provide low voltage level; the first node Q(n) is maintained at high voltage level due to the storage function of the bootstrap capacitor C1; the second thin-film transistor T2 is turned on, the high voltage level of the clock signal CK2 is outputted to the output terminal G(n), and thus the output terminal G(n) outputs high voltage level and this further makes the first node Q(n) be pulled up to a higher voltage level, and the eighth and the tenth thin-film transistors T8 and T10 are still turned on; the second and the fourth nodes P(n) and M(n) are maintained at the constant low voltage level VGL, the sixth and the seventh thin-film transistors T6 and T7 controlled by the second node P(n) are still turned off, and the ninth thin-film transistor T9 controlled by the fourth node M(n) is still turned off.

Stage III (the output terminal G(n) outputs low voltage level): the clock signal CK2 is changed to low voltage level, both of the clock signal CK3 and the output terminal G(n+1) provide high voltage level, and the clock signals CK1 and CK4 and the output terminal G(n−1) still provide low voltage level; the third thin-film transistor T3 is turned on by the clock signal CK3; the first node Q(n) is maintained at the high voltage level, and the second, the eighth, and the tenth thin-film transistors T2, T8, and T10 controlled by the first node Q(n) are still turned on; the second and the fourth nodes P(n) and M(n) are maintained at the constant low voltage level VGL, the sixth and the seventh thin-film transistors T6 and T7 controlled by the second node P(n) are still turned off, and the ninth thin-film transistor T9 controlled by the fourth node M(n) is still turned off; since the second thin-film transistor T2 is still turned on, the low voltage level of the clock signal CK2 can be outputted to the output terminal G(n), and thus the output terminal G(n) outputs low voltage level.

Stage IV (the first node Q(n) is pulled down to the constant low voltage level VGL): the clock signal CK1 provides high voltage level again, and the clock signals CK2, CK3, and CK4 and the output terminal G(n−1) provide low voltage level; the first thin-film transistor T1 is turned on by the clock signal CK1 and thus the first node Q(n) is pulled down to the constant low voltage level VGL; the second, the eighth, and the tenth thin-film transistors T2, T8, and T10 controlled by the first node Q(n) is turned off.

Stage V (the first node Q(n) and the output terminal G(n) are maintained at low voltage level): the fourth node M(n)

is always at high voltage level due to the fractional voltage from the resistor R1, the ninth thin-film transistor T9 is always turned on, and the timing signal Reset will be transmitted to the second node P(n); as the timing signal Reset alternatively provides high and low voltage levels, the voltage level of the second node P(n) is correspondingly changed from high to low or from low to high, that is, the changing frequency of the high and low voltage levels of the second node P(n) is consistent with that of the timing signal Reset. When the timing signal Reset is at high voltage level, the second node P(n) will be charged to high voltage level and the sixth and the seventh thin-film transistors T6 and T7 are turned on; when the timing signal Reset is at low voltage level, the second node P(n) will be pulled down to low voltage level and the sixth and the seventh thin-film transistors T6 and T7 are turned off; the first node Q(n) and the output terminal G(n) are maintained at low voltage level. That is, in the stage maintaining the output terminal G(n) at low voltage level, the voltage level of the second node P(n) is correspondingly changed between the high and low voltage levels as the timing signal Reset is changed between the high and low voltage levels.

Specifically, the high voltage level V2 of the timing signal Reset is less than or equal to the constant high voltage level VGH and is greater than the threshold voltages VTH of the sixth and the seventh thin-film transistors T6 and T7 (i.e., VTH<V2=VGH); the low voltage level V1 of the timing signal Reset is less than 0 and is higher than or equal to the constant low voltage level VGL (i.e., VGL=V<0). The corresponding duty cycle of the timing signal Reset may be 25%, 33%, or 50% as long as under a certain duty cycle, a shift of the threshold voltage (e.g., the Vth shifts to right) caused by the high voltage level V2 and a shift the threshold voltage (e.g., the Vth shifts to left) caused by the low voltage level V1 can be cancelled out from each other for a certain degree.

In the existing skills, the second node P(n) is maintained at high voltage level for a long time and the sixth and the seventh thin-film transistors T6 and T7 are continuously turned on in one frame period. In comparison thereto, in the GOA electric circuit based on LTPS thin-film transistors provided in the present invention, the voltage level of the second node P(n) is pulled down in a specific frequency in Stage V. This effectively prevents the second node P(n) from being at high voltage level for a long time and avoids the problem of threshold voltage shifting caused by the sixth and the seventh thin-film transistors T6 and T7 operated for a long time, and therefore improves the stability of GOA electric circuit.

Figure 5:
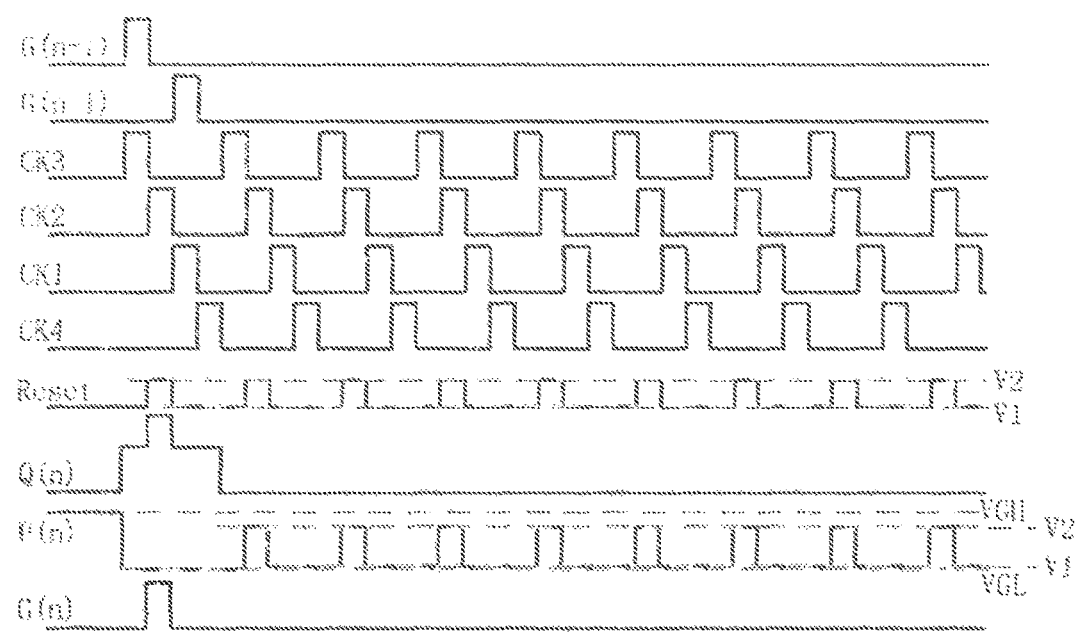
FIG. 5 is a timing chart of a backward scanning in the GOA electric circuit based on LTPS semiconductor thin-film transistors shown in FIG. 3 in accordance with the present invention.

Please refer to FIG. 5, which is a timing chart of a backward scanning in the GOA electric circuit based on LTPS semiconductor thin-film transistors shown in FIG. 3 in accordance with the present invention. Since the forward scanning and the backward scanning are operated in a similar fashion, the backward scanning is described briefly below. The processes of the backward scanning are described below.

Stage I (pre-charging): both of the clock signal CK3 and the output terminal G(n+) provide high voltage level, the third thin-film transistor T3 is turned on by the clock signal CK3, the third node K(n) is pre-charged to high voltage level, and the eighth and the tenth thin-film transistors T8 and T10 are turned on by the third node K(n); the fifth thin-film transistor T5 is always turned on by the constant high voltage level VGH, and thus the voltage level of the first node Q(n) is always the same as that of the third node K(n), that is, the first node Q(n) is pre-charged to high voltage level; the second and the fourth nodes P(n) and M(n) are pulled down to the constant low voltage level VGL, the sixth, the seventh, and the ninth thin-film transistors T6, T7, and T9 are turned off.

Stage II (the output terminal G(n) outputs high voltage level): the clock signal CK2 provides high voltage level; the first node Q(n) is maintained at high voltage level due to the storage function of the bootstrap capacitor C1; the second thin-film transistor T2 is turned on, the high voltage level of the clock signal CK2 is outputted to the output terminal G(n), and thus the output terminal G(n) outputs high voltage level and this further makes the first node Q(n) be pulled up to a higher voltage level.

Stage III (the output terminal G(n) outputs low voltage level): the clock signal CK2 is changed to low voltage level, both of the clock signal CK1 and the output terminal G(n−1) provide high voltage level, the first node Q(n) is still maintained at the high voltage level, the second thin-film transistor T2 is still turned on, the low voltage level of the clock signal CK2 is outputted to the output terminal G(n), and thus the output terminal G(n) outputs low voltage level.

Stage IV (the first node Q(n) is pulled down to the constant low voltage level VGL): the clock signal CK3 provides high voltage level again, and the output terminal G(n+1) provide low voltage level; the third thin-film transistor T3 is turned on and thus the first node Q(n) is pulled down to the constant low voltage level VGL.

Stage V (the first node Q(n) and the output terminal G(n) are maintained at low voltage level): after the voltage level of the first node Q(n) is pulled down to the constant low voltage level VGL, the second, the eighth, and the tenth thin-film transistors T2, T8, and T10 are turned off, and the first node Q(n) and the output terminal G(n) are maintained at low voltage level; the fourth node M(n) is always at high voltage level due to the fractional voltage from the resistor R1, the ninth thin-film transistor T9 is always turned on, and the timing signal Reset will be transmitted to the second node P(n); as the timing signal Reset alternatively provides high and low voltage levels, the voltage level of the second node P(n) is correspondingly changed from high to low or from low to high, that is, the changing frequency of the high and low voltage levels of the second node P(n) is consistent with that of the timing signal Reset. When the timing signal Reset is at high voltage level, the second node P(n) will be charged to high voltage level and the sixth and the seventh thin-film transistors T6 and T7 are turned on; when the timing signal Reset is at low voltage level, the second node P(n) will be pulled down to low voltage level and the sixth and the seventh thin-film transistors T6 and T7 are turned off. That is, in the stage maintaining the output terminal G(n) at low voltage level, the voltage level of the second node P(n) is correspondingly changed between the high and low voltage levels as the timing signal Reset is changed between the high and low voltage levels.

Specifically, the high voltage level V2 of the timing signal Reset is less than or equal to the constant high voltage level VGH and is greater than the threshold voltages VTH of the sixth and the seventh thin-film transistors T6 and T7 (i.e., VTH<V2=VGH); the low voltage level V1 of the timing signal Reset is less than 0 and is higher than or equal to the constant low voltage level VGL (i.e., VGL=V1<0). The corresponding duty cycle of the timing signal Reset may be 25%, 33%, or 50% as long as under a certain duty cycle, a shift of the threshold voltage (e.g., the Vth shifts to right) caused by the high voltage level V2 and a shift the threshold voltage (e.g., the Vth shifts to left) caused by the low voltage level V1 can be cancelled out from each other for a certain degree.

In the existing skills, the second node P(n) is maintained at high voltage level for a long time and the sixth and the seventh thin-film transistors T6 and T7 are continuously turned on in one frame period. In comparison thereto, in the GOA electric circuit based on LTPS thin-film transistors provided in the present invention, the voltage level of the second node P(n) is pulled down in a specific frequency in Stage V. This effectively prevents the second node P(n) from being at high voltage level for a long time and avoids the problem of threshold voltage shifting caused by the sixth and the seventh thin-film transistors T6 and T7 operated for a long time, and therefore improves the stability of GOA electric circuit.

Above all, the GOA electric circuit based on LTPS semiconductor thin-film transistors provided in the present invention introduces a resistor and a timing signal. By adjusting high and low voltage levels of the second node P(n) and the frequency thereof, in the stage maintaining the output terminal G(n) at low voltage level, the voltage level of the second node P(n) can be correspondingly changed between high and low voltage levels as the timing signal is changed between high and low voltage levels, that is, the voltage level of the second node P(n) is pulled down in a specific frequency. This effectively prevents the second node P(n) from being at high voltage level for a long time and avoids the problem of threshold voltage shifting caused by the sixth and the seventh thin-film transistors T6 and T7 operated for a long time, and therefore improves the stability of GOA electric circuit and is suitable in designing a high-resolution liquid crystal panel. The electric circuit provided in the present invention is applicable to a gate driving technical field for a cell phone, a display, and a television.

Above descriptions are preferred embodiments of the present invention. It should be noted that various modifications and alterations can be made by persons skilled in this art without departing from the principles of the present invention, and that all modifications and alterations are within the scope of the present invention.

What is claimed is:

1. A GOA (Gate Driver on Array) electric circuit based on LTPS (Low Temperature Poly-silicon) semiconductor thin-film transistors, comprising a plurality of cascaded GOA units and each stage thereof comprising a scan control module, an output module, a bootstrap capacitor, and a pull-down module; n is a positive integer, in a nth-stage GOA unit except for a first stage and a last stage:

wherein the scan control module comprises a first thin-film transistor, a third thin-film transistor, and a fifth thin-film transistor; the first thin-film transistor has a gate electrode electrically connected to a first clock signal, a source electrode electrically connected to an output terminal G(n−1) of a previous-stage (the (n−1)th stage) GOA unit, and a drain electrode electrically connected to a third node; the third thin-film transistor has a gate electrode electrically connected to a third clock signal, a source electrode electrically connected an output terminal G(n+1) of a next-stage (the (n+1)th stage) GOA unit, and a drain electrode electrically connected to the third node; and the fifth thin-film transistor has a gate electrode electrically connected to a constant high voltage level, a source electrode electrically connected to the third node, and a drain electrode electrically connected to a first node;

wherein the output module comprises a second thin-film transistor; the second thin-film transistor has a gate electrode electrically connected to the first node, a source electrode electrically connected to a second clock signal, and a drain electrode electrically connected to an output terminal G(n);

wherein one terminal of the bootstrap capacitor is electrically connected to the first node and the other terminal thereof is electrically connected to the output terminal G(n);

wherein the pull-down module comprises a fourth thin-film transistor, a sixth thin-film transistor, a seventh thin-film transistor, an eighth thin-film transistor, a ninth thin-film transistor, a tenth thin-film transistor, and a resistor; the fourth thin-film transistor has a gate electrode electrically connected to a fourth clock signal, a source electrode electrically connected to a constant low voltage level, and a drain electrode electrically connected to the output terminal G(n); the sixth thin-film transistor has a gate electrode electrically connected to a second node, a source electrode electrically connected to the constant low voltage level, and a drain electrode electrically connected to the third node; the seventh thin-film transistor has a gate electrode electrically connected to the second node, a source electrode electrically connected to the constant low voltage level, and a drain electrode electrically connected to the output terminal G(n); the eighth thin-film transistor has a gate electrode electrically connected to the third node, a source electrode electrically connected to the constant low voltage level, and a drain electrode electrically connected to the second node; the ninth thin-film transistor has a gate electrode electrically connected to a fourth node, a source electrode electrically connected to a timing signal, a drain electrode electrically connected to the second node; the tenth thin-film transistor has a gate electrode electrically connected to the third node, a source electrode electrically connected to the constant low voltage level, and a drain electrode electrically connected to the fourth node; and one terminal of the resistor is electrically connected to the constant high voltage level and the other terminal thereof is electrically connected to the fourth node; and wherein all of the thin-film transistors are low temperature poly-silicon semiconductor thin-film transistors, the pulses of the first clock signal, the second clock signal, the third clock signal, and the fourth clock signal are sequentially outputted and are not overlapped with one another, and in a stage maintaining the output terminal G(n) at low voltage level, the voltage level of the second node is correspondingly changed between the high and low voltage levels as the timing signal is changed between the high and low voltage levels.

2. The GOA electric circuit according to claim 1, wherein the high voltage level of the timing signal is less than or equal to the constant high voltage level VGH and is greater than the threshold voltages of the sixth thin-film transistor and the seventh thin-film transistor; and the low voltage level of the timing signal is less than 0 and is greater than or equal to the constant low voltage level.

3. The GOA electric circuit according to claim 1, wherein a corresponding duty cycle of the timing signal is one of 25%, 33%, and 50%.

4. The GOA electric circuit according to claim 1, wherein in a forward scanning, both of the first clock signal and the output terminal G(n−1) electrically connected to the first thin-film transistor simultaneously provide high voltage level; and in a backward scanning, both of the third clock signal and the output terminal G(n+1) electrically connected to the third thin-film transistor simultaneously provide high voltage level.

5. A GOA (Gate Driver on Array) electric circuit based on LTPS (Low Temperature Poly-silicon) semiconductor thin-film transistors, comprising a plurality of cascaded GOA units and each stage thereof comprising a scan control module, an output module, a bootstrap capacitor, and a pull-down module; n is a positive integer, in a nth-stage GOA unit except for a first stage and a last stage:

wherein the scan control module comprises a first thin-film transistor, a third thin-film transistor, and a fifth thin-film transistor; the first thin-film transistor has a gate electrode electrically connected to a first clock signal, a source electrode electrically connected to an output terminal G(n−1) of a previous-stage (the (n−1)th stage) GOA unit, and a drain electrode electrically connected to a third node; the third thin-film transistor has a gate electrode electrically connected to a third clock signal, a source electrode electrically connected an output terminal G(n+1) of a next-stage (the (n+1)th stage) GOA unit, and a drain electrode electrically connected to the third node; and the fifth thin-film transistor has a gate electrode electrically connected to a constant high voltage level, a source electrode electrically connected to the third node, and a drain electrode electrically connected to a first node;

wherein the output module comprises a second thin-film transistor; the second thin-film transistor has a gate electrode electrically connected to the first node, a source electrode electrically connected to a second clock signal, and a drain electrode electrically connected to an output terminal G(n);

wherein one terminal of the bootstrap capacitor is electrically connected to the first node and the other terminal thereof is electrically connected to the output terminal G(n); and wherein the pull-down module comprises a fourth thin-film transistor, a sixth thin-film transistor, a seventh thin-film transistor, an eighth thin-film transistor, a ninth thin-film transistor, a tenth thin-film transistor, and a resistor; the fourth thin-film transistor has a gate electrode electrically connected to a fourth clock signal, a source electrode electrically connected to a constant low voltage level, and a drain electrode electrically connected to the output terminal G(n); the sixth thin-film transistor has a gate electrode electrically connected to a second node, a source electrode electrically connected to the constant low voltage level, and a drain electrode electrically connected to the third node; the seventh thin-film transistor has a gate electrode electrically connected to the second node, a source electrode electrically connected to the constant low voltage level, and a drain electrode electrically connected to the output terminal G(n); the eighth thin-film transistor has a gate electrode electrically connected to the third node, a source electrode electrically connected to the constant low voltage level, and a drain electrode electrically connected to the second node; the ninth thin-film transistor has a gate electrode electrically connected to a fourth node, a source electrode electrically connected to a timing signal, a drain electrode electrically connected to the second node; the tenth thin-film transistor has a gate electrode electrically connected to the third node, a source electrode electrically connected to the constant low voltage level, and a drain electrode electrically connected to the fourth node; and one terminal of the resistor is electrically connected to the constant high voltage level and the other terminal thereof is electrically connected to the fourth node.

6. The GOA electric circuit according to claim 5, wherein in a stage maintaining the output terminal G(n) at low voltage level, the voltage level of the second node is correspondingly changed between the high and low voltage levels as the timing signal is changed between the high and low voltage levels.

7. The GOA electric circuit according to claim 6, wherein the high voltage level of the timing signal is less than or equal to the constant high voltage level VGH and is greater than the threshold voltages of the sixth thin-film transistor and the seventh thin-film transistor; and the low voltage level of the timing signal is less than 0 and is greater than or equal to the constant low voltage level.

8. The GOA electric circuit according to claim 5, wherein a corresponding duty cycle of the timing signal is one of 25%, 33%, and 50%.

9. The GOA electric circuit according to claim 5, wherein the pulses of the first clock signal, the second clock signal, the third clock signal, and the fourth clock signal are sequentially outputted and are not overlapped with one another.

10. The GOA electric circuit according to claim 5, wherein in a forward scanning, both of the first clock signal and the output terminal G(n−1) electrically connected to the first thin-film transistor simultaneously provide high voltage level; and in a backward scanning, both of the third clock signal and the output terminal G(n+1) electrically connected to the third thin-film transistor simultaneously provide high voltage level.

11. The GOA electric circuit according to claim 5, wherein all of the thin-film transistors are low temperature poly-silicon semiconductor thin-film transistors.

* * * * *